(12) United States Patent
Parulkar

(10) Patent No.: US 7,757,133 B1
(45) Date of Patent: Jul. 13, 2010

(54) BUILT-IN SELF-TEST HARDWARE AND METHOD FOR GENERATING MEMORY TESTS WITH ARBITRARY ADDRESS SEQUENCES

(75) Inventor: Ishwardutt Parulkar, San Francisco, CA (US)

(73) Assignee: Oracle America, Inc., Santa Clara, CA (US)

( * ) Notice: Subject to any disclaimer, the term of this patent is extended or adjusted under 35 U.S.C. 154(b) by 278 days.

(21) Appl. No.: 11/773,554

(22) Filed: Jul. 5, 2007

(51) Int. Cl.
*G11C 29/00* (2006.01)
*G01R 31/28* (2006.01)

(52) U.S. Cl. .................... 714/718; 714/733
(58) Field of Classification Search ............... 714/718, 714/733
See application file for complete search history.

(56) References Cited

U.S. PATENT DOCUMENTS

| | | | | |
|---|---|---|---|---|
| 5,535,164 A | * | 7/1996 | Adams et al. ............... | 365/201 |
| 5,844,914 A | * | 12/1998 | Kim et al. .................... | 714/718 |
| 7,093,176 B2 | * | 8/2006 | Nicolaidis et al. ............ | 714/733 |
| 7,184,356 B2 | * | 2/2007 | Noguchi et al. ........ | 365/230.03 |
| 7,184,915 B2 | * | 2/2007 | Hansquine et al. .......... | 702/118 |
| 7,293,212 B2 | | 11/2007 | Allue | |
| 7,302,625 B1 | | 11/2007 | Payakapan | |
| 7,319,625 B2 | | 1/2008 | Chang | |
| 7,392,442 B2 | * | 6/2008 | Averbuj et al. ............... | 714/718 |
| 2006/0190788 A1 | * | 8/2006 | Jasinski et al. .............. | 714/733 |

* cited by examiner

*Primary Examiner*—James C Kerveros
(74) *Attorney, Agent, or Firm*—Meyertons, Hood, Kivlin, Kowert & Goetzel, P.C.; Erik A. Heter

(57) ABSTRACT

An integrated circuit (IC) having a memory built-in self-test (MBIST) controller. The IC includes an MBIST controller and a plurality of memory arrays. One or more the memory arrays has a different physical organization with respect to other ones of the memory arrays. The MBIST controller is configured to generate a logical address of a memory under test. The MBIST controller is further configured to permute the bits to produce a physical address. The user programmed permutation enables a simple address incrementer to create an address sequence that traverses the physical organization of the memory in accordance with the type of desired test.

20 Claims, 5 Drawing Sheets

| 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|
| U | U | U | U | U | U | U | U | U | U | U | U | U | B | B | R | U | R | R | C | C |

Where: R = Row
B = Bank
C = Column
U = Unused

Start Address:

| X | X | X | X | 0 | 0 | 0 | 0 | 0 | 0 | 0 | 0 | 0 | 0 | 0 | 1 | 0 | 0 | 0 | 1 | 0 | 0 |

End Address:

| X | X | X | X | 0 | 0 | 0 | 0 | 0 | 0 | 0 | 0 | 0 | 0 | 1 | 1 | 0 | 1 | 0 | 1 | 1 |

Fig. 3A

Sequence to Run Fast Row:

Where: R = Row
B = Bank
C = Column
U = Unused

Start Address:

End Address:

BUILT-IN SELF-TEST HARDWARE AND METHOD FOR GENERATING MEMORY TESTS WITH ARBITRARY ADDRESS SEQUENCES

BACKGROUND OF THE INVENTION

1. Field of the Invention

This invention relates to electronic circuits, and more particularly, to the testing of memories embedded on an integrated circuit.

2. Description of the Related Art

Many integrated circuits (IC's) include one or more memory arrays implemented thereupon. For example, microprocessors incorporate a number of different memory arrays, including multiple cache memories (e.g., L1 and L2 cache memories, an instruction cache memory, a data cache memory, etc.), a translation lookaside buffer, register files and associated register maps (for mapping logical register names to physical register names), FIFO (first-in, first-out) memories, content addressable memories (CAM's) and so forth. In some modern microprocessors, the number of embedded memory arrays can exceed 100. Other types of IC's, such as application specific integrated circuits (ASIC's) can include a similar number of memory arrays. These memory arrays may differ with each other in type, capacity, and physical organization.

Each of the different memory arrays is subject to certain types of faults/defects. These types of faults include coupling faults, pattern sensitive faults, stuck open faults, and so forth. Thus, testing of these memory arrays is required in order to ensure that they are free of defects. This testing is typically accomplished by BIST (built-in self-test) controllers embedded on the same IC as the memory arrays.

Certain types of memory array defects (e.g., pattern sensitive faults, coupling defects) may be related to the physical organization of a memory array. Accordingly, for a BIST to be effective, it must take into account the physical organization of the memory when generating sequences of address for reads and writes. If the physical organization is not taken into account, the BIST may fail to fully exercise those fault modes that are dependent thereon.

In implementing BIST controllers to test memory arrays, multiple approaches may be taken. However, each of these approaches has drawbacks. If memory BIST controllers are to take into account the physical organization of the various embedded memory arrays, a significant amount of logic may be required. This can result in a separate memory BIST controller for each of the different memory arrays or different types (by physical organization) of memory arrays. Alternatively, a single memory BIST controller with logic to account for each of the different types of arrays (according to physical organization) may be implemented. However, both of these solutions may require a prohibitive amount of die area on an IC, and thus may be impractical for IC's with a large number of embedded memory arrays having different physical organizations.

Alternatively, a smaller, single memory BIST controller that addresses each memory array using logical addresses may be implemented. However, this solution may be unsatisfactory from a test point of view, as it does not take into account the physical organization of the memory and may thus fail to exercise those failure modes which are dependent thereon.

Accordingly, with the increasing amount of functionality implemented on a single IC and corresponding requirements for additional memory arrays, the BIST solutions discussed above may be unsatisfactory, if not unfeasible altogether.

SUMMARY OF THE INVENTION

An integrated circuit (IC) having a memory built-in self-test (MBIST) controller is disclosed. In one embodiment, the IC includes an MBIST controller and a plurality of memory arrays. One or more the memory arrays has a different physical organization with respect to other ones of the memory arrays. The MBIST controller is configured to test each of the plurality of memory arrays, taking into account the physical organization of each. The MBIST controller is configured to generate a logical address of a memory array under test. The MBIST controller is further configured to permute the bits of the logical address to produce a physical address in accordance with the type of test conducted and the physical organization of the memory array under test.

In one embodiment, the MBIST controller includes a state machine, an address generator, a data generator, a read/write control generator, and a comparator. The address generator includes programmability to permute the logical sequence of the address space of an array as described earlier. The data generator can be programmed to write desired data into the array under test and generate the data used for comparison with the data read from the memory under test. The state machine is configured to generate a test algorithm (March algorithms known in the art, such as MATS, MATS+, MarchC−, MOVI, etc.) that uses the data generated by the data generator and the permuted address sequence generated by the address generator. The state machine also coordinates the generation of the read and write controls and comparison operation (which compares data read from the memory with expected data) at the appropriate time as required by the test algorithm.

The MBIST controller is shared by each of the memory arrays of the IC. That is, the MBIST controller is configured to conduct testing of each of the memory arrays, taking into account the physical organization of each. This is accomplished despite the variation in physical organization among the various memory arrays implemented on the IC. Thus, a single MBIST controller can be used to perform testing for a large number of memory arrays having a different physical organization with respect to the others.

A method of operating an MBIST controller is also contemplated, wherein the method includes a single MBIST controller conducting memory testing of a plurality of different memory arrays of differing physical organization. Conducting testing of the memory arrays includes permuting bits of a logic address to produce a physical address in accordance with the type of test to be conducted (e.g., fast row, fast column, etc.) and the physical organization of the memory array under test.

Furthermore, for a given instance of memory, the BIST controller is capable of generating 'fast row' and 'fast column' type of variants of the March algorithms where a certain physical address sequence needs to be imposed on the test. This is accomplished by programming the permutable address generator to sequence through address bits associated with the memory columns or the memory rows first. The sequence can be arbitrary, depending on faults being targeted, and need not be restricted to fast row or fast column.

BRIEF DESCRIPTION OF THE DRAWINGS

Other aspects of the invention will become apparent upon reading the following detailed description and upon reference to the accompanying drawings in which:

FIG. 3A is a drawing illustrating address bit locations for one of a plurality of memory arrays that may be tested by one embodiment of an MBIST controller;

FIG. 3B is a drawing illustrating a sequence of addresses required to run a fast row test for the embodiment of the memory having the physical organization illustrated in FIG. 3A;

Figure 1:
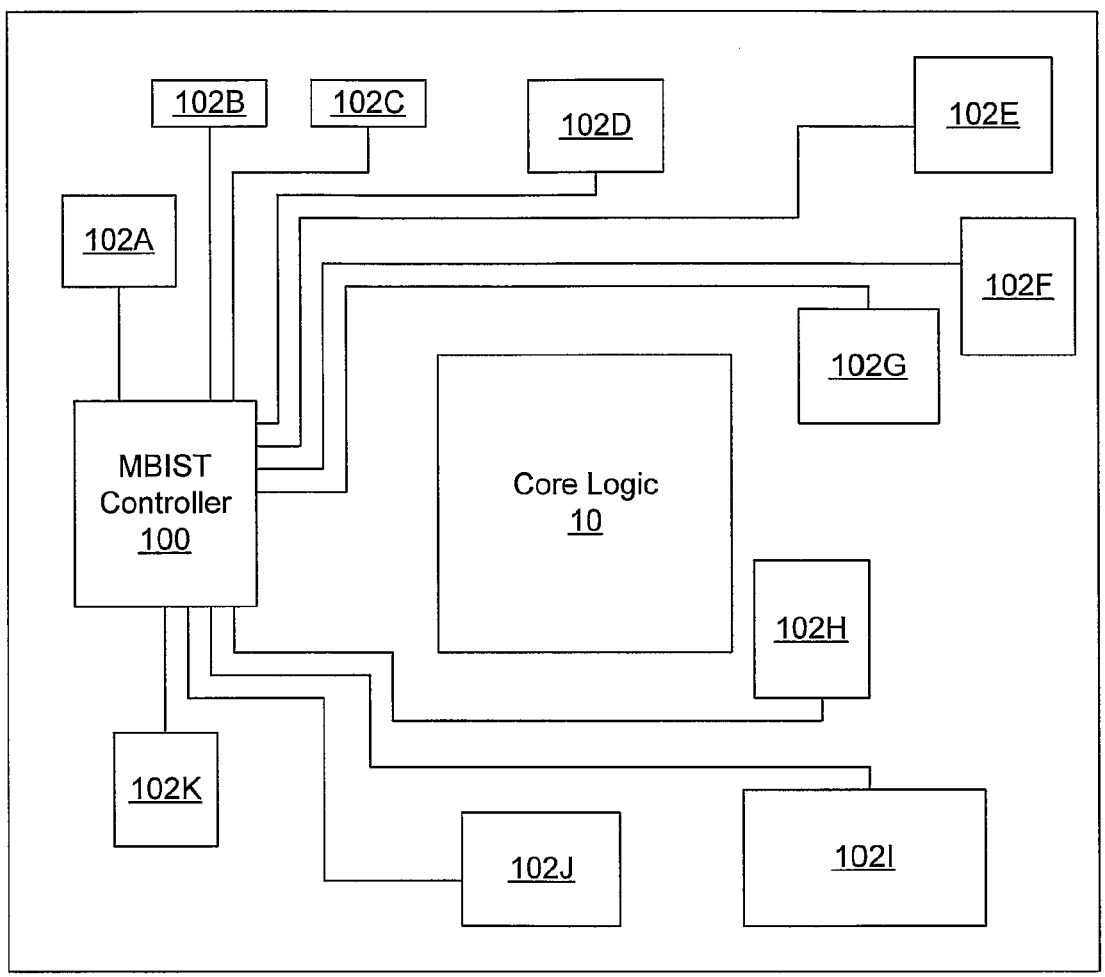
FIG. 1 is an illustration of one embodiment of an integrated circuit including a plurality of memory arrays and a memory built-in self-test (MBIST) controller configured to test the memory arrays.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, an illustration of one embodiment of an integrated circuit including a plurality of memory arrays and a memory built-in self-test (MBIST) controller configured to test the memory arrays is shown. In the embodiment shown, integrated circuit (IC) 5 includes a core logic unit 10, a memory built-in self-test (MBIST) controller 100, and a plurality of memory arrays 102A-102K. IC 5 may be one of many different types of integrated circuits, such as a central processor for a computer system, a digital signal processing chip, an I/O chip, or one of many different types of application specific integrated circuits (ASICs).

As previously noted, IC 5 includes a plurality of memory arrays (102A-K in this particular embodiment). These memory arrays may include cache memories (e.g., L1 cache, L2 cache), register files, address buffers (e.g., a translation lookaside buffer), FIFO (first-in, first out) memories, I/O buffers, reservation stations, and so forth. In general, there is no particular limit to the number of memory arrays that may be implemented on IC 5, and embodiments having in excess of 100 different memory arrays are possible and contemplated.

The various memory arrays implemented on IC 5 may have differing physical organizations with respect to other memory arrays implemented thereon. These variations may include variations in storage capacity, the organization (e.g., rows, columns, banks), the size of various organizational parts (e.g., number of rows per column), or any other physical characteristic that can distinguish one memory array from another.

MBIST controller 100 is configured to perform tests of each of the memory arrays implemented on IC 5. More particularly, in conducting a test, MBIST controller is configured to take into account the physical organization of the memory array under test. In the embodiment shown, MBIST controller may conduct various types of tests on each of the memory arrays such as fast row, fast column, fast bank, and so on. For a fast row test, MBIST controller cycles through all the rows of a given column (conducting reads and writes therein), moves to a next column and again cycles through all the rows, and so forth. A fast column test is similar with the exception that it cycles through the columns of a row, moves to a next row, cycles through its, columns, and so forth. A fast bank test may perform fast, sequential reads and writes of storage locations within banks of a memory array (and may incorporate a fast row or fast column test, if appropriate for the banks).

Each of these types of tests requires MBIST controller to take into account the physical organization of the memory array to be tested. In some prior art embodiments, a dedicated MBIST controller was provided for each memory array on an IC in order to enable it to account for its physical organization. In other prior art embodiments, a single MBIST controller was provided for testing all the memory arrays, wherein the MBIST controller did not account for the physical organization of each. In contrast, the embodiment shown and discussed herein is directed to an IC including a plurality of memory arrays with different physical organizations and a single MBIST controller configured to teach each, wherein the testing of any one of the memory arrays takes into account its physical organization.

Figure 2:
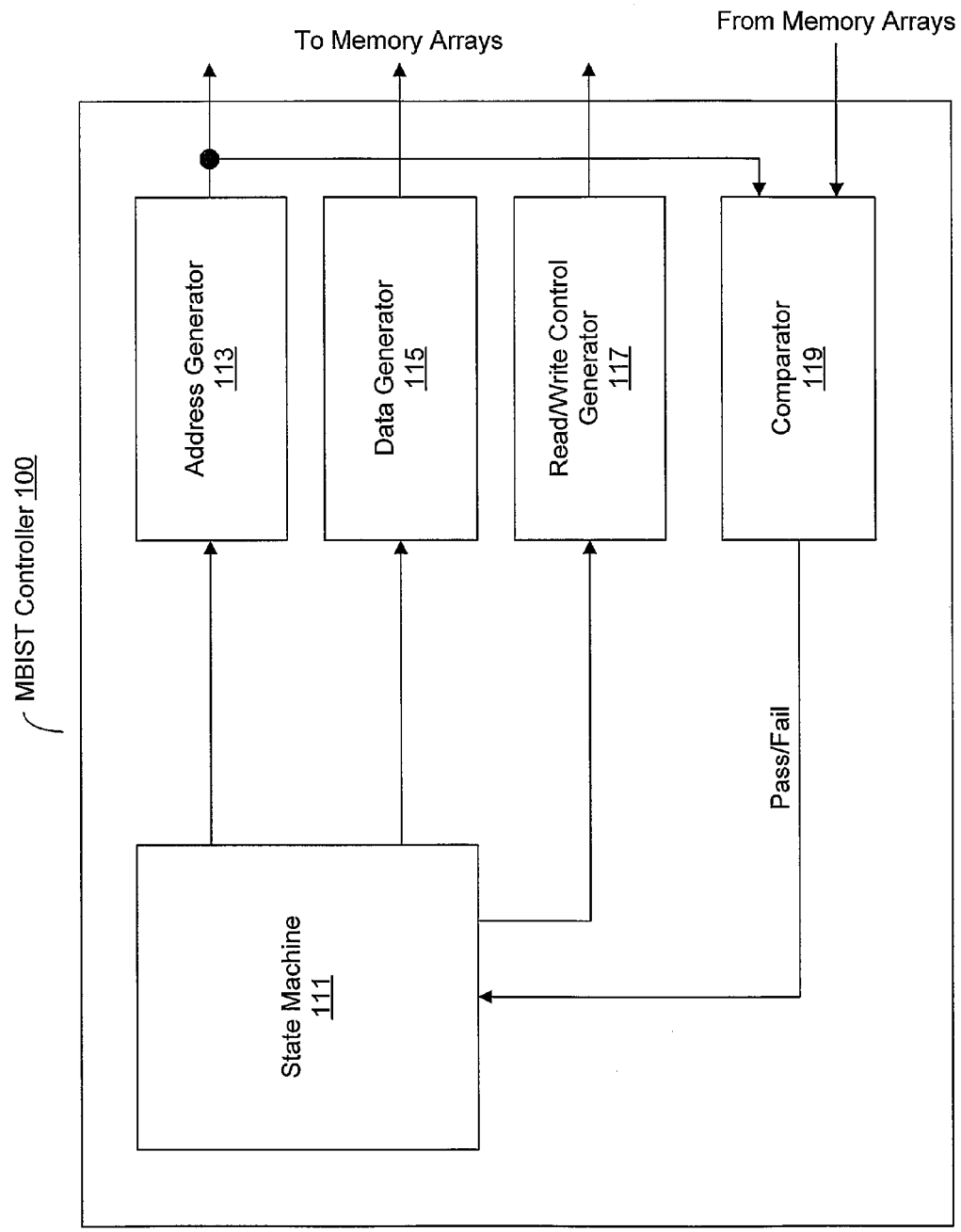
FIG. 2 is a block diagram of one embodiment of an MBIST controller configured to test a plurality of memory arrays having differing physical organizations.

FIG. 2 is a block diagram of one embodiment of an MBIST controller configured to test a plurality of memory arrays having differing physical organizations. In the embodiment shown, MBIST controller 100 includes state machine 111, address generator 113, data generator 115, read/write control generator 1117, and comparator 119. Each of these units will be now be explained in further detail.

State machine 111 is configured to generate test algorithms for testing each of the memories on the IC upon which it is implemented. A test algorithm generated by state machine 111 are based both on the physical organization of the memory array to be tested, the type of test to be conducted, and the type of faults that may be expected. Based on the physical organization of a memory array to be tested, state machine 111 may generate a test algorithm that includes test types such as a fast bank test, fast column test, fast row test, or other suitable test.

The test algorithm generated by state machine 111 also includes information about patterns in which data is written to and read from the memory. The wide variety of test patterns available and the faults that may be detected by each will be appreciated by those skilled in the art. Examples of such patterns are the MATS patterns (MATS, MATS+, MATS++), Marching I/O, March A patterns (March A, March A+, March A++), March X, March Y, March SR+, 9N Linear pattern, 13N pattern, MovC pattern, Moving inversion. Various embodiments of state machine 111 may generate test algorithms using these or other memory test patterns. The types of faults that may be detected using these patterns include (but are not limited to) stuck-at faults, address decoder faults, transition faults, coupling faults, and so forth.

Address generator 113 is coupled to receive information regarding the test algorithm from state machine 111. In the embodiment shown, address generator 113 is configured to generate logical addresses for the memory array to be tested, and to permute bits of the logical addresses to produce a sequence of physical addresses in accordance with the test algorithm and the physical organization of the memory array. The sequence of addresses generated is based both on the physical organization of the memory array under test as well as the particular type of test (or tests) to be conducted. These addresses are then provided to the memory array during testing. Additional details of the generation of addresses by address generator 113 will be discussed below.

Data generator 115 is coupled to receive information regarding test algorithms from state machine 111. Responsive to receiving this information, data generator 115 is configured to generate data to be written to a memory array under test. The data may be generated based on a pattern that is part of the test algorithm, as discussed above. The patterns may include various sequences of logic 0's and logic 1's that may be written to the memory during testing. Furthermore, data may be generated for multiple reads and writes to each address of the memory during testing in accordance with the pattern used in the test algorithm. Data generator 115 is also configured to convey generated data to the target memory array during testing.

Based on information regarding the test algorithm received from state machine 111, read/write control generator 117 is configured to generate control signal to be conveyed to a memory array under test. Types of control signals generated may include column address strobe, row address strobe, write enable, bank select, and any other type of control signal that may be associated with the memory arrays implemented on the IC. Read/write control generator 117 conveys the appropriate signals as necessary to the memory array under test at the appropriate times and in accordance with the test algorithm an the physical organization of the memory.

Comparator 119 is configured to receive data from both data generator 115 and from the memory array under test. Data received from the memory array under test is compared with expected data (based on the data received from data generator 115) to determine a pass/fail status of the memory array. The comparator may provide signals to the state machine indicating whether or not a particular test passed or failed.

Figures 3A, 3B:
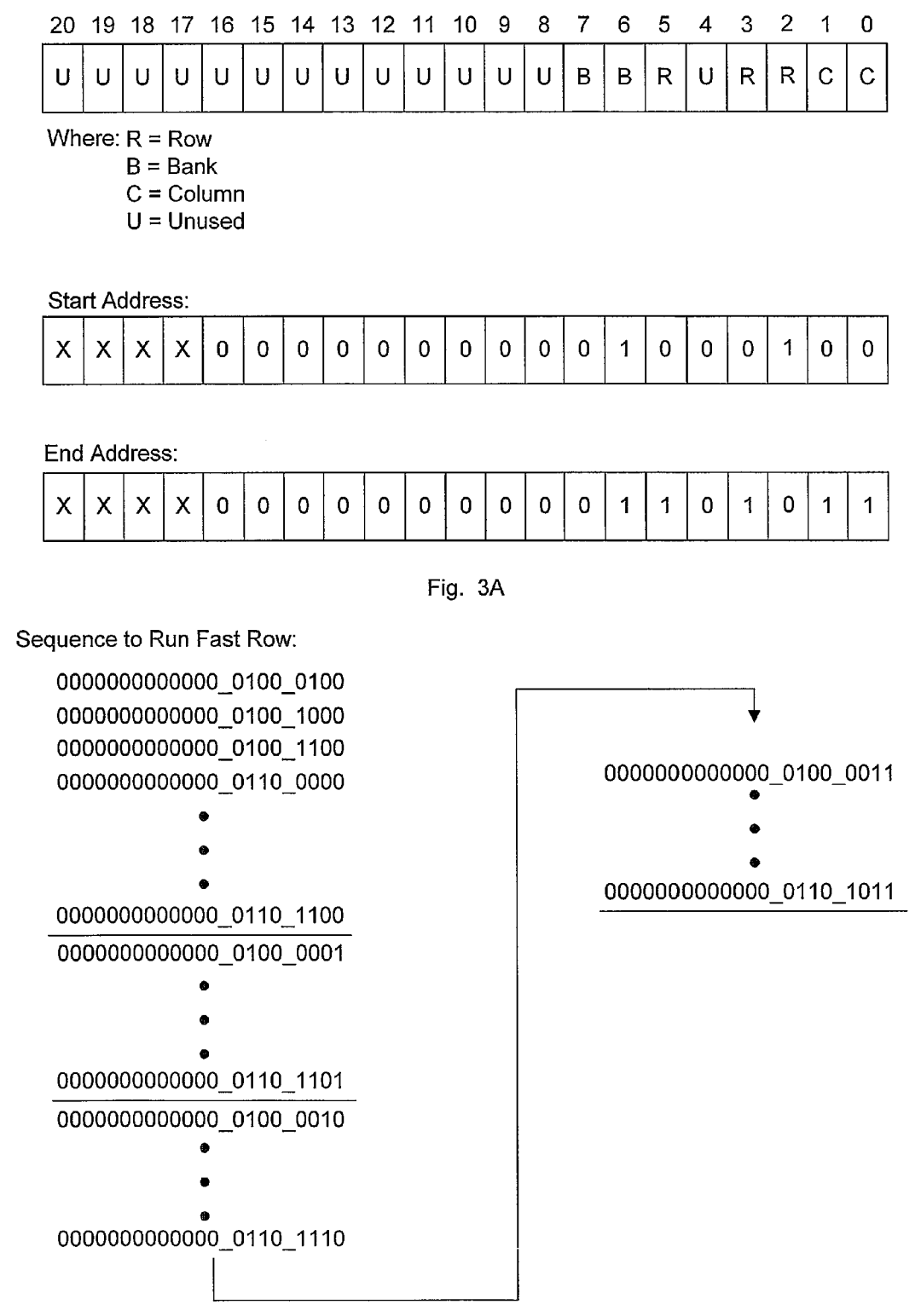

Turning now to FIG. 3A, a drawing illustrating address bit locations for one of a plurality of memory arrays that may be tested by one embodiment of an MBIST controller is shown. In this embodiment the number of address bits required for the largest memory array implemented on the IC is 21 bits, while the number of bits used by the memory array addressed in this particular example is 7 bits. Thus, of the 21 bits, 14 are unused ('U'). The memory array of this particular example includes 4 banks and thus 2 bits ('B') reserved for bank selection. The memory array also includes 4 columns and thus 2 bits ('C') reserved for column selection and 8 rows with 3 bits ('R') reserved for row selection. The bits for bank selection are located in positions 7 and 6, the bits for column selection are located in positions 1 and 0, while the bits for row selection are located in positions 5, 3, and 2. Position 4 is unused for address selection for the memory array of this example. In this example, a fast row test is to be conducted beginning at address 0100__0100 (for the sake of simplicity, only the last 8 bits are displayed here), and ending at address 0110__1011.

It should noted that the memory array referenced by this example is exemplary, and is thus not representative of all the memory arrays on an IC that implements the MBIST controller discussed herein. Furthermore, it is also noted that such an IC would include other memory arrays having a different physical organization with respect to the one referenced in this example.

FIG. 3B is a drawing illustrating a sequence of addresses required to run a fast row test for the embodiment of the memory having the physical organization illustrated in the example of FIG. 3A. It should be noted that a fast row test is used as an example here, but similar examples using sequences of address for conducting a fast column or fast bank test may also apply.

In order to run a fast row test, a column is first selected. After selecting the column, the address locations of every row in the column are tested by a series of writes and reads in accordance with the selected pattern(s) of the generated test algorithm. After all the rows of a given column have been tested, another column is selected and the cycle repeats for each of the rows. This cycle can be repeated for all rows and all columns of a given memory array, and may also include the selection of different banks for memories that are so organized.

In the sequence shown, the test begins by selecting a bank and a column, and then progresses through a sequence of addresses that select the various rows within the selected bank/column. The test progresses by sequencing the address to cycle through the each of the rows of each column (including both banks). However, given the positioning of the bits in the address, the address cannot simply be incremented by a value of '1' for each new address. Instead, each individual bit position has to be manipulated independent of the others in order to cycle through the necessary sequence to conduct a fast row test (or for that matter, a fast column or fast bank test). Manipulating each bit position independently of the others would require additional logic. Furthermore, the requirement to independently manipulate each bit position for a number of memory arrays having varying physical organizations with respect to each other would require a prohibitive amount of logic. However, MBIST controller 100 is configured to solve this problem, as will now be discussed.

Figure 4:
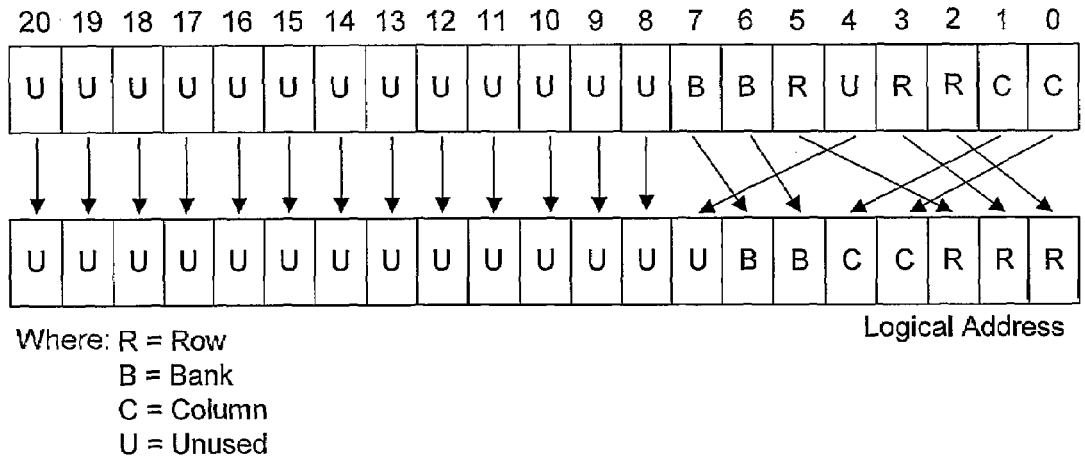
FIG. 4 is a drawing illustrating the mapping relationship between bit positions of a logical address and bit positions of a physical address for one embodiment of a memory array.
Figure 4:
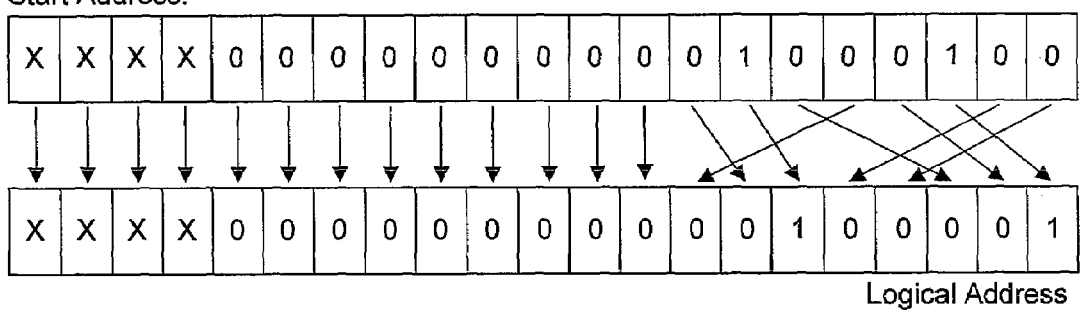
Figure 4:
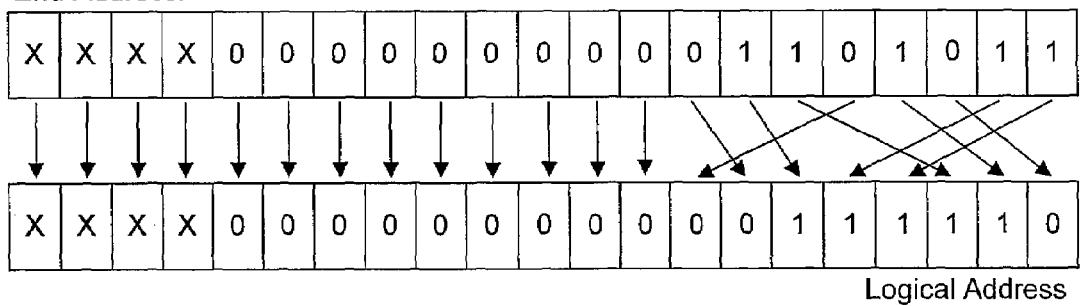

FIG. 4 is a drawing illustrating the mapping relationship between bit positions of a logical address and bit positions of a physical address for one embodiment of a memory array. More particularly, FIG. 4 illustrates how MBIST controller 100 can re-map bits of an memory address to produce a logical address for running various tests.

In the example shown, the address bits are to be re-mapped in to simplify the running of a fast row test. Thus, the 3 bit positions corresponding to row selections are re-mapped to the 3 least significant bit positions of the address (positions 0, 1, and 2), maintaining their order of significance with respect to each others. Next, the 2 bit positions corresponding to column selections are re-mapped to next two least significant bit positions (positions 3 and 4), also maintaining their relative order of significance with respect to each other. Finally, the 2 bit positions corresponding to bank selections are re-mapped to the next 2 least significant bit positions remaining (positions 5 and 6). The unused bit in position 4 is re-mapped to bit position 7. Based on this re-mapping the starting logical address of the fast row test sequence shown in FIG. 3B is 0010__0001, while the ending logical address is 0011__1110, as shown in the drawing. While this range of addresses shown in this example may cover only a portion of the memory array, it is nevertheless possible to test the entirety of the memory array (e.g., starting at logical address 0000__0000 and ending at address 0111__1111). The sequence of corresponding logical addresses may be generated by providing the beginning logical address and simply adding a value of logic 1 each time the test is to progress to the next address.

It should be noted that similar re-mappings may be performed in order to simplify the performance of a fast column, fast bank, or other type of test. In general, MBIST controller 100 is configured to re-map bits according to the type of test to be performed and the physical organization of the memory to be tested. This function may be performed either by state machine 111 or address generator 113.

Thus, the used address bits for the memory array to be tested in this example are all re-mapped to the least significant bit positions, while the remaining, unused bits are re-mapped to bit positions of greater significance. Furthermore, since the bits are grouped by function (e.g., row selection bits adjacent to each other, then column bits, etc.), a fast row test can be conducted by simply incrementing the address by a value of logic 1 in order to move to the next row.

Figure 5:
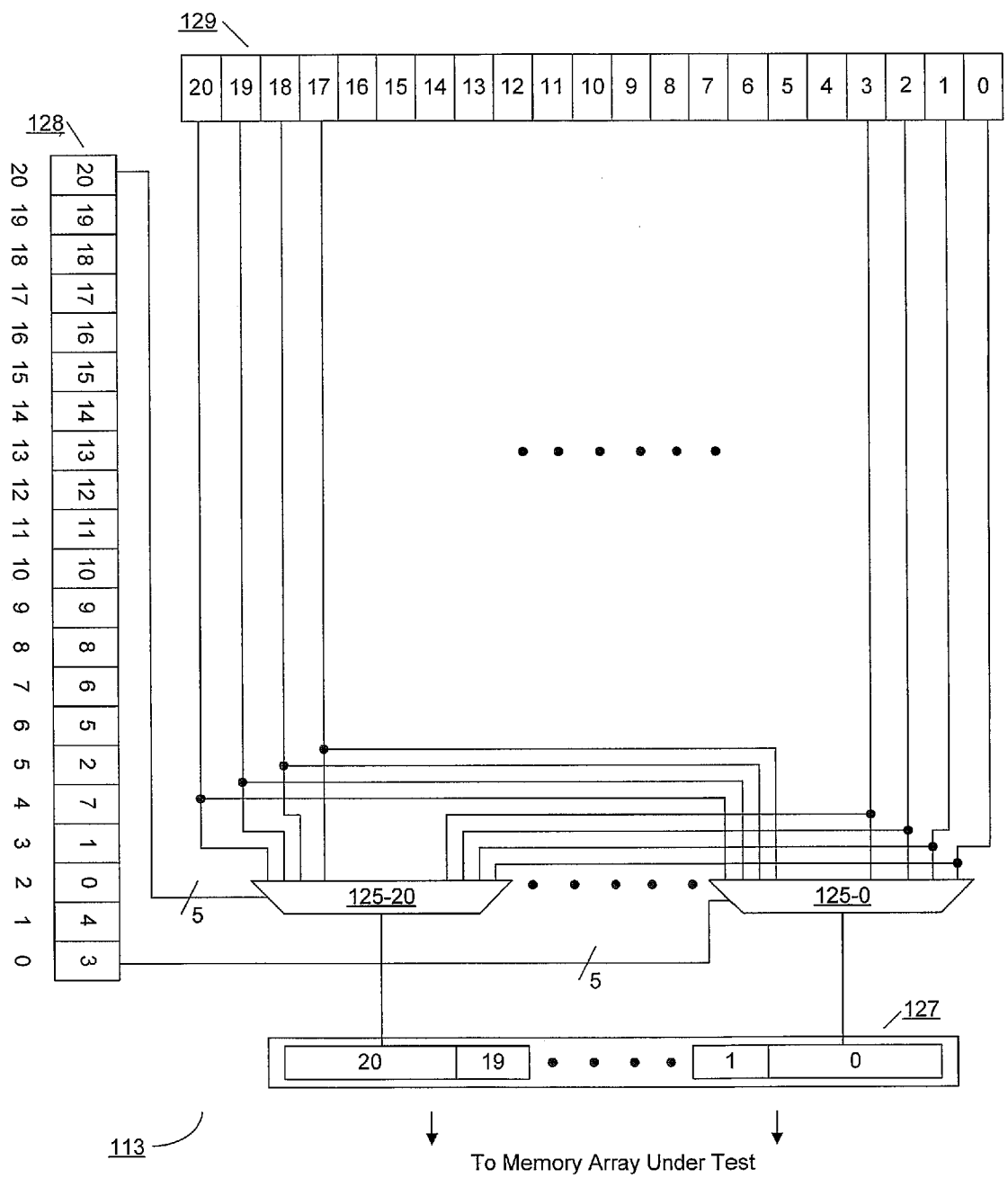
FIG. 5 is a logic diagram of circuitry in comprised in an address generator of one embodiment of an MBIST controller wherein the circuitry enables permutation of address bits.

Although re-mapping may simplify the generation of addresses and address sequences for testing the various memory arrays of the IC, it remains that physical addresses are required when addressing a memory array under test. FIG. 5 is a logic diagram of circuitry in comprised in an address generator of one embodiment of MBIST controller 100 wherein the circuitry enables permutation of address bits. More particularly, the circuitry shown in FIG. 5 enables permutation of the logical address bits to obtain physical addresses that can be provided to a memory array under test.

The circuitry shown in FIG. 5, which is a portion of the circuitry of address generator 113, includes a mapping register 128, a logical address register 129, a plurality of multiplexers 125-0 to 125-20 (only the first and last are shown here for the sake of simplicity, although the presence of the others is understood), and a physical address register 127.

In the embodiment shown, mapping register 128 stores the mapping associations between the logical addresses and the physical addresses that must be conveyed to the memory array under test. Each position in the mapping register 128 corresponds to a bit position of a physical address that is to be conveyed to the memory array under test. The values stored in each position represent a bit position in the logical address, and are each represented by a 5-bit value. The 5-bit values stored in each position of mapping register 128 are each conveyed to a corresponding multiplexer 125 as a plurality of selection inputs.

Logical address register 129 is configured to store a logical address. In one embodiment, a starting logical address is generated as shown in FIG. 4 and stored in logical address register 129. In some embodiments, subsequent logical addresses may be generated and written into logical address register 129, while in other embodiments, the address value may be incremented by simply adding a logic '1'. In either case, logical address register 129 is configured to store the next logical address that corresponds to a physical address of the memory array under test that is to be accessed by MBIST controller 100.

In order to access the memory array's address location in that corresponds to the logical address in stored in logical address register 129, the bits of the logical address must be permuted to form the physical address. This is accomplished by selecting a logical address bit and moving it to the appropriate position in physical address generator 127. As previously noted, mapping register 128 stores mapping logical-to-physical mapping information in each position and provides this information as select inputs to multiplexers 125. Each of the multiplexers 125 is coupled to receive an input from each of the bit positions of logical address register 129. Based on the state of the selection inputs, each multiplexer 125 selects one of the bit positions of the logical address register 129. The bit in the selected position of logical address register 129 is then propagated and stored in its mapped position within physical address register 127.

In this particular example, the mapping information stored in map register 128 corresponds to the example used in FIG. 4. In the first position (position 0) of mapping register 128, a value corresponding to position 3 of the logical address register 129 is stored. This value will be reflected on the select inputs that are provided to multiplexer 125-0, whose output is coupled to position 0 of physical address register 127. Based on the received select inputs in this particular example, multiplexer 125-0 will select position 3 of logical address register 129, the value of which is then stored in position 0 of physical address register 127. Similarly, position 4 of logical address register 129 will be selected by a multiplexer 125-1 (not shown here for the sake of simplicity, although its presence is understood) to be stored in poisoned 1 of physical address register 127. In this manner, the logical address bits are permuted in order to produce a physical address that can be conveyed to the memory array under test, as each position of mapping register 128 stores information that correlates a bit position in logical register 129 to a bit position in physical register 127. The address stored in logical register 127 is conveyed to the memory array under test.

During the performance of a given test, the contents of mapping register 128 will remain constant, while the contents of logical address register 129 and physical address register 127 will be updated for each new address in the sequence. As noted above, this updating may be accomplished by incrementing the values stored in logical address register 129 by a value of '1' for each new address to be accessed. Alternatively, the logical address may be updated and then written into logical address register 129. By keeping the contents of mapping register 128 constant while updating the contents of logical address register 129 in a simplified manner, a sequence of physical address can be output by address generator 113 that enables tests such as fast row, fast column or fast bank to be conducted. Since the contents of mapping register 128 may be updated, address generator 113 can effectively be programmed to change the logical-to-physical address mapping for testing any memory array implemented on the IC according to the memory array's physical organization and the type of test to be conducted. As such, a single MBSIT controller can be implemented to test a large number of memory arrays implemented on the same IC, taking into account the physical organization of each.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
  a plurality of memory arrays implemented on the integrated circuit, wherein one or more of the plurality of memory arrays has a physical organization that is different with respect to other ones of the plurality of memory arrays;
  a memory built-in self-test (MBIST) controller implemented on the integrated circuit and configured to test each of the plurality of memory arrays, wherein the MBIST controller is configured to generate a first logical address sequence for a test of a first one of the plurality of memory arrays, and wherein the MBIST controller is programmable to permute bits of each logical address of the first logical address sequence to produce a first physical address sequence depending on a type of test conducted and a physical organization of the first memory array;
  wherein the MBIST controller is further configured to generate a second logical address sequence for a test of a second one of the plurality of memory arrays, and wherein the MBIST controller is programmable to permute bits of each logical address of the second logical address sequence to produce a second physical address sequence depending on a type of test conducted and a physical organization of the second memory array, wherein the physical organization of the second memory array is different from the physical organization of the first memory array.

2. The integrated circuit as recited in claim 1, wherein said testing comprises performing a march test for each of the plurality of memory arrays.

3. The integrated circuit as recited in claim 2, wherein the march test includes performing a fast row test.

4. The integrated circuit as recited in claim 2, wherein the march test includes performing a fast column test.

5. The integrated circuit as recited in claim 2, wherein the march test includes performing a fast bank test.

6. The integrated circuit as recited in claim 1, wherein the MBIST controller includes a state machine, wherein the state machine is configured to generate test algorithms for testing each of the plurality of memory arrays.

7. The integrated circuit as recited in claim 6, wherein the MBIST controller includes an address generator coupled to the state machine, wherein the address generator includes circuitry configured to permute the bits of the logical address to produce the physical address for the according to the conducted test and a physical organization of the memory array under test.

8. The integrated circuit as recited in claim 7, wherein the address generator is programmable to generate a sequence of addresses based on a physical organization of the memory array under test and the type of test conducted.

9. The integrated circuit as recited in claim 8, wherein the address generator includes a plurality of multiplexers, wherein each of the plurality of multiplexers includes:
a first plurality of inputs, each of the first plurality of inputs corresponding to one bit position of the logical address;
a second plurality of inputs, wherein each of the second plurality of inputs is a select input; and
an output, wherein the output is associated with a bit position of the physical address to be provided to the memory array under test;
wherein each of the plurality of multiplexers is configured to map a bit position of the logical address to a bit position of the physical address.

10. The integrated circuit as recited in claim 9, wherein the address generator is configured to increment the logical address.

11. The integrated circuit as recited in claim 6, wherein the MBIST controller includes a data generator coupled to the state machine, wherein the data generator is configured to generate data to be written to the memory array under test.

12. The integrated circuit as recited in claim 6, wherein the MBIST controller includes a comparator coupled to the state machine, wherein the comparator is configured to compare data read from the memory array under test to expected data, and wherein the comparator is coupled to provide a pass/fail signal to the state machine based on comparisons of the data read from the memory array under test to the expected data.

13. The integrated circuit as recited in claim 6, wherein the MBIST controller includes a read/write control generator coupled to the state machine, wherein the read/write control generator is configured to generate read and write control signals based on a test algorithm generated by the state machine.

14. A method for operating a memory built-in self-test (MBIST) controller, the method comprising:
generating one or more logical addresses for a first memory array under test, wherein the first memory array under test is one of a plurality of memory arrays implemented on an integrated circuit (IC), wherein the first memory array under test has a physical organization that is different with respect to other ones of the plurality of memory arrays;
permuting bits of the one or more logical addresses to produce one or more physical addresses;
conducting a test of the first memory array, wherein conducting the test includes providing a sequence of physical addresses to the first memory array based on said permuting; and
repeating said generating, said permuting, and said conducting for one or more additional memory arrays of the plurality of memory arrays, wherein at least one of the one or more additional memory arrays has a physical organization that is different with respect to other ones of the plurality of memory arrays;
wherein said generating, said permuting, said conducting and said repeating are performed by a single MBIST controller, and wherein the MBIST controller and each of the plurality of memory arrays are implemented on a single integrated circuit.

15. The method as recited in claim 14 further comprising performing said generating, said permuting, said conducting, and said repeating for the first memory array, a second memory array, and a third memory array, wherein each of the first, second, and third memory arrays has a physical organization that is different with respect to other ones of the first, second, and third memory arrays.

16. The method as recited in claim 14, wherein said conducting a test comprises conducting one or more march tests, wherein the one or more march tests includes one or more of a fast row test, a fast column test, and/or a fast bank test.

17. The method as recited in claim 14, wherein the MBIST controller is configured to conduct testing for each of the plurality of memory arrays, wherein, for each of the plurality of memory arrays, the MBIST controller is configured to generate and conduct testing based on its physical organization.

18. The method as recited in claim 17, wherein the MBIST controller includes a state machine, a data generator, a read/write control generator, and a comparator.

19. The method as recited in claim 18, wherein the address generator is configured to permute bits of logical addresses of a memory array to produce physical addresses of the memory array according to a physical organization of the memory array and a type of test to be conducted.

20. The method as recited in claim 19, wherein said permuting comprises mapping bit positions of a logical address to bit positions of a corresponding physical address according to the physical organization of the memory array and the type of test to be conducted.

* * * * *